(12) United States Patent
Kim et al.

(10) Patent No.: US 10,283,197 B1
(45) Date of Patent: May 7, 2019

(54) ELECTRONIC DEVICE AND METHOD FOR READING DATA OF MEMORY CELL

(71) Applicant: SK hynix Inc., Icheon (KR)

(72) Inventors: Myoung-Sub Kim, Seongnam (KR); Seok-Man Hong, Seoul (KR); Tae-Hoon Kim, Seongnam (KR)

(73) Assignee: SK hynix Inc., Icheon (KR)

( * ) Notice: Subject to any disclaimer, the term of this patent is extended or adjusted under 35 U.S.C. 154(b) by 0 days.

(21) Appl. No.: 15/669,758

(22) Filed: Aug. 4, 2017

Related U.S. Application Data

(60) Provisional application No. 62/371,621, filed on Aug. 5, 2016.

(51) Int. Cl.
G11C 13/00 (2006.01)
G06F 3/06 (2006.01)

(52) U.S. Cl.
CPC ........ G11C 13/0033 (2013.01); G06F 3/0604 (2013.01); G06F 3/0659 (2013.01); G06F 3/0673 (2013.01); G11C 13/0002 (2013.01); G11C 13/004 (2013.01); G11C 13/0004 (2013.01); G11C 2013/0052 (2013.01); G11C 2213/76 (2013.01)

(58) Field of Classification Search
CPC ............ G11C 13/0002; G11C 13/0033; G11C 2013/0052; G11C 13/004; G11C 2213/76
See application file for complete search history.

(56) References Cited

U.S. PATENT DOCUMENTS

| 6,914,801 | B2 | 7/2005 | Kostylev et al. | |
|---|---|---|---|---|
| 9,099,174 | B2* | 8/2015 | Calderoni | ............... G11C 11/00 |
| 9,627,055 | B1* | 4/2017 | Robustelli | .......... G11C 13/0033 |
| 9,858,999 | B2* | 1/2018 | Calderoni | ............ G11C 13/004 |
| 2012/0014164 | A1* | 1/2012 | Kamoshida | ........ G11C 13/0004 |
| | | | | 365/148 |

* cited by examiner

Primary Examiner — Vanthu T Nguyen

(57) ABSTRACT

A method for reading a data of a memory cell comprising a selection device and a resistive memory device which has a high resistance state or a low resistance state according to a data stored therein includes: applying a first read voltage to the memory cell; applying a second read voltage to the memory cell, the second read voltage having a level lower than a level of the first read voltage; and sensing the data of the memory cell while the second read voltage is applied to the memory cell.

5 Claims, 9 Drawing Sheets

ELECTRONIC DEVICE AND METHOD FOR READING DATA OF MEMORY CELL

CROSS-REFERENCE TO RELATED APPLICATIONS

The present application claims priority to U.S. Provisional Application No. 62/371,621, entitled "ELECTRONIC DEVICE AND METHOD FOR READING DATA OF MEMORY CELL" and filed on Aug. 5, 2016, which is incorporated herein by reference in its entirety.

TECHNICAL FIELD

This patent document relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PCRAM (phase-change random access memory), a PRAM (phase change random access memory), an FRAM (ferroelectric random access memory), an MRAM (magnetic random access memory), an E-fuse, etc.

Particularly, resistive memory devices may form a memory cell array in a cross point array. A cross point array may refer to a structure where a plurality of bottom electrodes (e.g., a plurality of row lines (word lines)) and a plurality of top electrodes (e.g., a plurality of column lines (bit lines)) are formed to be crossed and memory cells each of which includes a variable resistance device and a selection device are coupled to each other in series are positioned at the cross points.

SUMMARY

The disclosed technology in this patent document includes memory circuits or devices and their applications in electronic devices or systems and various implementations of an electronic device which includes an electronic device for stably reading data of a resistive memory.

In an implementation, a method for reading a data of a memory cell comprising a selection device and a resistive memory device which has a high resistance state or a low resistance state according to a data stored therein: applying a first read voltage to both ends of the memory cell; applying a second read voltage whose voltage level is lower than a voltage level of the first read voltage to both ends of the memory cell; and sensing the data of the memory cell while the second read voltage is applied.

The first read voltage may have a voltage level that turns on the memory cell when the first read voltage is applied to both ends of the memory cell and the resistive memory device is in the low resistance state, and turns off the memory cell when the first read voltage is applied to both ends of the memory cell and the resistive memory device is in the high resistance state.

The voltage level of the second read voltage may be higher than a voltage level of a voltage that turns off the memory cell when the voltage is applied to the memory cell while the memory cell is turned on.

The selection device may have snapback characteristics.

The selection device may be an Ovonic Threshold Switch (OTS) device.

In another implementation, an electronic device includes: a semiconductor memory, wherein the semiconductor memory includes: a memory cell comprising a resistive memory device that has a high resistance state or a low resistance state according to a data stored therein; and a selection device which is serially coupled to the resistive memory device, and during a read operation of the memory cell a first read voltage may be applied to both ends of the memory cell, and then a second read voltage whose voltage level is lower than a voltage level of the first read voltage may be applied to both ends of the memory cell, and the data of the memory cell may be sensed while the second read voltage is applied.

The first read voltage may have a voltage level that turns on the memory cell when the first read voltage is applied to both ends of the memory cell and the resistive memory device is in the low resistance state and turns off the memory cell when the first read voltage is applied to both ends of the memory cell and the resistive memory device is in the high resistance state.

The voltage level of the second read voltage may be higher than a voltage level of a voltage that turns off the memory cell when the voltage is applied to the memory cell while the memory cell is turned on.

The selection device may have snapback characteristics.

The selection device may be an Ovonic Threshold Switch (OTS) device.

The electronic device may further include a micro-processor, wherein the micro-processor includes: a control unit that receives a signal including a command from exterior of the micro-processor, and controls an extraction or decryption of the command or input/output of the signal of the micro-processor; an operation unit that performs an operation based on a command decryption result of the control unit; and a memory unit that stores data for performing an operation, operation result data, and addresses for the data for performing the operation, and the semiconductor memory may be a portion of the memory unit inside the micro-processor.

The electronic device may further include a processor, wherein the processor includes: a core unit that performs an operation corresponding to a command by using a data upon a receipt of the command inputted from exterior of the processor; a cache memory unit that stores data for performing an operation, operation result data, and addresses for the data for performing the operation; and a bus interface that is coupled between the core unit and the cache memory unit, and transfers a data between the core unit and the cache memory unit, and the semiconductor memory is a portion of the cache memory unit inside the processor.

The electronic device may further include a processing system, wherein the processing system may include: a processor that analyzes a received command so as to produce a command analysis result and controls an operation of information based on the command analysis result; an auxiliary memory device that stores a program for analyzing the command and stores the information; a main memory device that receives and stores the program and the information from the auxiliary memory device so that the processor performs the operation based on the program and the information when the program is implemented; and an interface device that communicates one or more among the processor, the auxiliary memory device, and the main memory device with an external device, and the semiconductor memory may be a portion of the auxiliary memory device or the main memory device inside the processing system. The electronic device may further include a data storing system, wherein the data storing system may include: a storage device that stores data and retains the data stored therein with no regard to whether a power supply is cut off or not; a controller that controls input/output of the data to/from the storage device according to an external command; a temporary storage device that temporarily stores data that are exchanged between the storage device and an external device; and an interface that communicates one or more among the storage device, the controller, and the temporary storage device with an external device, and the semiconductor memory may be a portion of the storage device or the temporary storage device inside the data storing system.

The electronic device may further include a memory system, wherein the memory system may include: a memory that stores data and retains the data stored therein with no regard to whether a power supply is cut off or not; a memory controller that controls input/output of the data to/from the memory according to an external command; a buffer memory that buffers data that are exchanged between the memory and an external device; and an interface that communicates one or more among the memory, the memory controller, and the buffer memory with an external device, and the semiconductor memory may be a portion of the memory or the buffer memory inside the memory system.

In another implementation, an electronic device includes: an electronic device includes: a semiconductor memory, wherein the semiconductor memory includes: a cell array which includes a plurality of memory cells that are arrayed in a plurality of columns and a plurality of rows; a read voltage applying circuit which applies a first read voltage to a selected memory cell that is selected among the plurality of the memory cells and applies a second read voltage which is lower than the first read voltage to the selected memory cell; and a sensing circuit which senses the data of the selected memory cell while the second read voltage is applied to the selected memory cell.

Each of the plurality of the memory cells may include: a resistive memory device that has a high resistance state or a low resistance state according to a data stored therein; and a memory cell that includes a selection device which is serially coupled to the resistive memory device.

The first read voltage may have a voltage level that turns on the selected memory cell when the first read voltage is applied to the selected memory cell and the resistive memory device of the selected memory cell is in the low resistance state and turns off the selected memory cell when the first read voltage is applied to both ends of the selected memory cell and the resistive memory device of the selected memory cell is in the high resistance state.

The voltage level of the second read voltage may be higher than a voltage level of a voltage that turns off the selected memory cell when the voltage is applied to the selected memory cell while the selected memory cell is turned on.

The selection device may have snapback characteristics.

The selection device may be an Ovonic Threshold Switch (OTS) device.

While the first read voltage is applied to the selected memory cell, a first voltage whose voltage level is lower than the voltage level of the first read voltage may be applied to memory cells that are not selected among the plurality of the memory cells, and while the second read voltage is applied to the selected memory cell, a second voltage whose voltage level is lower than the voltage level of the first voltage may be applied to the memory cells that are not selected among the plurality of the memory cells.

The first voltage may have a voltage level that is a half of the voltage level of the first read voltage.

The electronic device may further include a micro-processor, wherein the micro-processor may include: a control unit that receives a signal including a command from exterior of the micro-processor, and controls an extraction or decryption of the command or input/output of the signal of the micro-processor; an operation unit that performs an operation based on a command decryption result of the control unit; and a memory unit that stores data for performing an operation, operation result data, and addresses for the data for performing the operation, and the semiconductor memory may be a portion of the memory unit inside the micro-processor.

The electronic device may further include a processor, wherein the processor may include: a core unit that performs an operation corresponding to a command by using a data upon a receipt of the command inputted from exterior of the processor; a cache memory unit that stores data for performing an operation, operation result data, and addresses for the data for performing the operation; and a bus interface that is coupled between the core unit and the cache memory unit, and transfers a data between the core unit and the cache memory unit, and the semiconductor memory may be a portion of the cache memory unit inside the processor.

The electronic device may further include a processing system, wherein the processing system may include: a processor that analyzes a received command so as to produce a command analysis result and controls an operation of information based on the command analysis result; an auxiliary memory device that stores a program for analyzing the command and stores the information; a main memory device that receives and stores the program and the information from the auxiliary memory device so that the processor performs the operation based on the program and the information when the program is implemented; and an interface device that communicates one or more among the processor, the auxiliary memory device, and the main memory device with an external device, and the semiconductor memory may be a portion of the auxiliary memory device or the main memory device inside the processing system.

The electronic device may further include a data storing system, wherein the data storing system may include: a storage device that stores data and retains the data stored therein with no regard to whether a power supply is cut off or not; a controller that controls input/output of the data to/from the storage device according to an external command; a temporary storage device that temporarily stores data that are exchanged between the storage device and an external device; and an interface that communicates one or more among the storage device, the controller, and the temporary storage device with an external device, and the semiconductor memory may be a portion of the storage device or the temporary storage device inside the data storing system.

The electronic device may further include a memory system, wherein the memory system may include: a memory that stores data and retains the data stored therein with no regard to whether a power supply is cut off or not; a memory controller that controls input/output of the data to/from the memory according to an external command; a buffer memory that buffers data that are exchanged between the memory and an external device; and an interface that communicates one or more among the memory, the memory controller, and the buffer memory with an external device, and the semiconductor memory may be a portion of the memory or the buffer memory inside the memory system.

DETAILED DESCRIPTION

Figure 1:
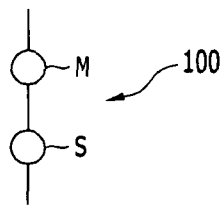
FIG. 1 illustrates a memory cell of a semiconductor memory device.

Various examples and implementations of the disclosed technology are described below in detail with reference to the accompanying drawings.

Exemplary implementations of the present disclosure will be described below in more detail with reference to the accompanying drawings. The present disclosure may, however, be embodied in different forms and should not be construed as limited to the implementations set forth herein. Rather, these implementations are provided so that this disclosure will be thorough and complete, and will fully convey the scope of the present disclosure to those skilled in the art. Throughout the disclosure, like reference numerals refer to like parts throughout the various figures and embodiments of the present disclosure.

Figure 2:
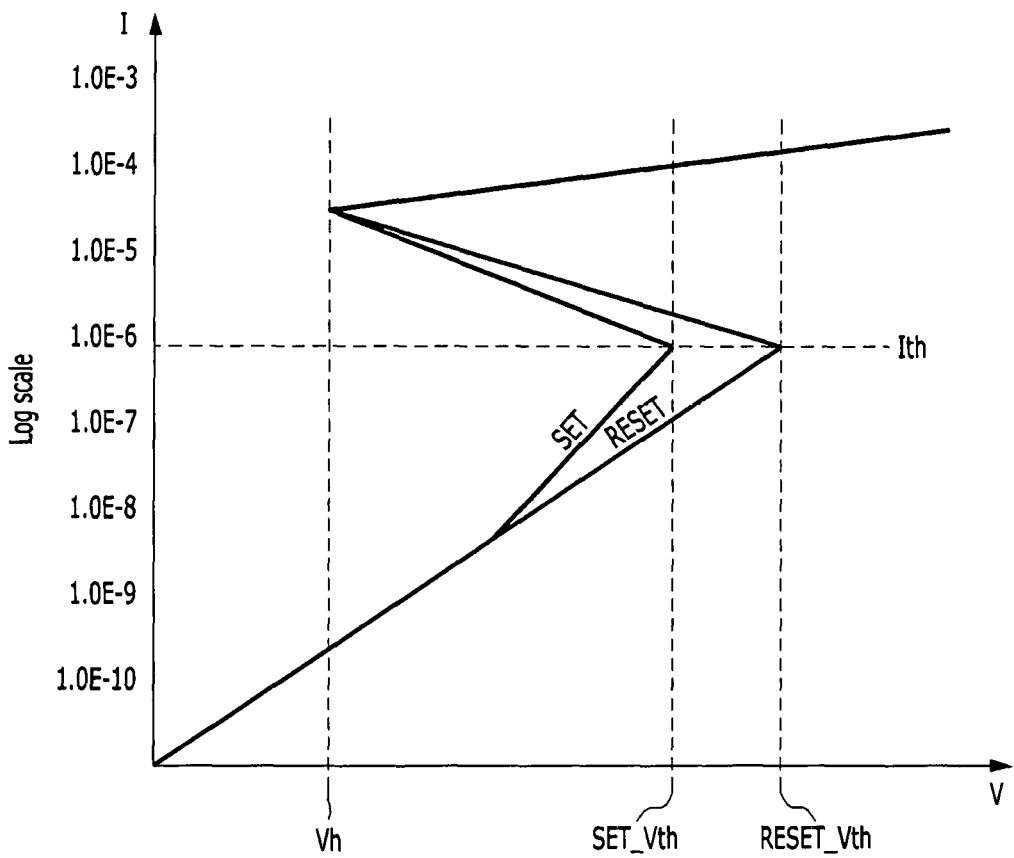
FIG. 2 is a graph illustrating an I-V curve of the memory cell shown in FIG. 1.

FIG. 1 illustrates a memory cell 100 of a semiconductor memory device. FIG. 2 is a graph illustrating a current-voltage (I-V) curve of the memory cell 100.

Referring to FIG. 1, the memory cell 100 may include a resistive memory device M and a selection device S.

The resistive memory device M may be in a low resistance state (e.g., a 'set' state) or a high resistance state (e.g., a 'reset' state) according to data stored therein. The resistive memory device M may be a phase-change memory device. In this case, when the resistive memory device M has a crystalline state, the resistive memory device M may have a low resistance value. When the resistive memory device M has an amorphous state, the resistive memory device M may have a high resistance value.

When the selection device S is turned off, a current having a relatively small amount flows through the memory cell 100. When the amount of the current flowing through the memory cell 100 exceeds a value of a threshold current Ith, the selection device S is turned on. When the selection device S is turned on, the amount of the current increases compared to when the selection device S is turned off. After the selection device S is turned on, a snapback phenomenon where a level of a voltage applied to both ends of the memory cell 100 is drastically reduced may occur. The selection device S may be an Ovonic Threshold Switch (OTS) device.

FIG. 2 is a graph illustrating the current I flowing through the memory cell 100 of FIG. 1 according to the voltage V that is applied to the both ends of the memory cell 100. Regardless of whether the memory cell 100 has a high resistance state RESET or has a low resistance state SET, when a level of the voltage V increases, the amount of the current I flowing through the memory cell 100 may increase. With respect to the same voltage level, the amount of the current I when the memory cell 100 has the low resistance state SET is greater than that when the memory cell 100 has the high resistance state RESET.

When the voltage V applied to the memory cell 100 having the low resistance state SET reaches a first threshold value (or a first threshold voltage) SET_Vth, the amount of the current flowing through the memory cell 100 reaches the value of the threshold current Ith, and thus the selection device S of the memory cell 100 may be turned on. As a result, the level of the voltage V applied to the both ends of the memory cell 100 is drastically reduced while the amount of the current flowing through the memory cell 100 is remarkably increased. That is, the snapback phenomenon occurs in the memory cell 100.

When the level of the voltage V applied to the memory cell 100 having the high resistance state RESET reaches a second threshold value (or a second threshold voltage) RESET_Vth, the amount of the current flowing through the memory cell 100 reaches the value of the threshold current Ith, the selection device S of the memory cell 100 may be turned on. As a result, the level of the voltage V applied to the both ends of the memory cell 100 is drastically reduced while the amount of the current flowing through the memory cell 100 is remarkably increased. That is, the snapback phenomenon occurs in the memory cell 100.

Figure 3A:
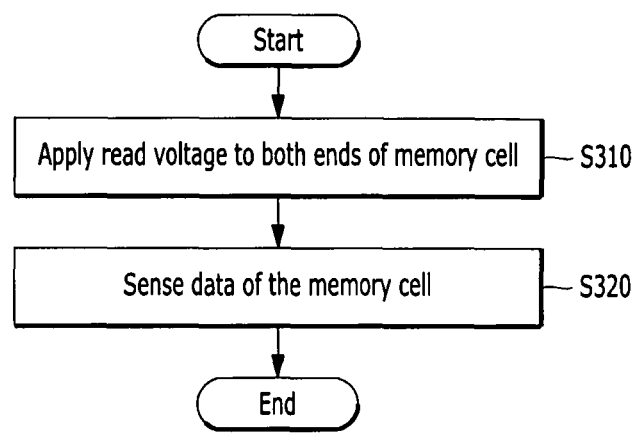
FIGS. 3A and 3B illustrate a read operation of the memory cell shown in FIG. 1 in accordance with an implementation of the present disclosure.
Figure 3B:
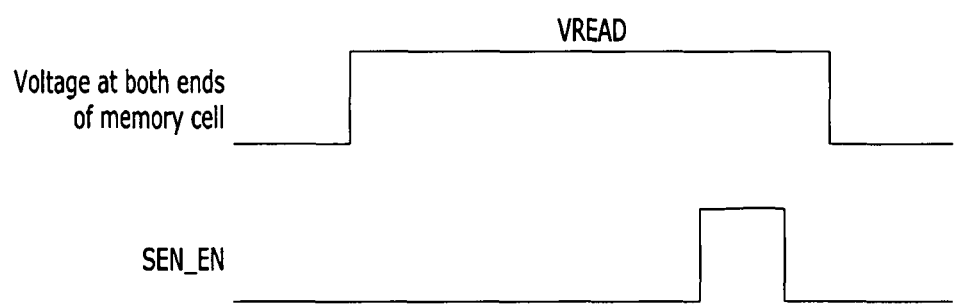

FIGS. 3A and 3B illustrate a read operation of the memory cell 100 of FIG. 1 in accordance with an implementation of the present disclosure. FIG. 3A is a flowchart illustrating a process of performing the read operation on the memory cell 100, and FIG. 3B illustrates example waveforms of a read voltage VREAD applied to the memory cell 100 and a sensing enable signal SEN_EN, during the read operation.

Referring to FIG. 3A, at S310, the read voltage VREAD may be applied to the both ends of the memory cell 100. The read voltage VREAD may have a value that is greater than a first threshold value (e.g., the first threshold voltage SET_Vth of FIG. 2) and smaller than a second threshold value (e.g., the second threshold voltage RESET_Vth of FIG. 2).

When the read voltage VREAD is applied to the memory cell 100 and the resistive memory device M of the memory cell 100 has the low resistance state SET, the memory cell 100 may be turned on, and the snapback phenomenon occurs. Thus, a current flowing through the memory cell 100 may have a relatively large amount.

In contrast, when the read voltage VREAD is applied to the memory cell 100 and the resistive memory device M of the memory cell 100 has the high resistance state RESET, the memory cell 100 may not be turned on, and the snapback phenomenon may not occur. Thus, the current flowing through the memory cell 100 may have a relatively small amount. FIG. 3B shows that the read voltage VREAD is applied to the memory cell 100.

While the read voltage VREAD is applied to the memory cell 100, the data stored in the memory cell 100 may be sensed at S320. The data may be sensed according to the amount of the current flowing through the memory cell 100. When the amount of the current flowing through the memory cell 100 is relatively large, the resistive memory device M may have the low resistance state SET. When the amount of the current flowing through the memory cell 100 is relatively small, the resistive memory device M may have the high resistance state RESET. Referring to FIG. 3B, the data of the memory cell 100 may be sensed when the sensing enable signal SEN_EN is enabled to have a specific logic value (e.g., a logic high value), while the read voltage VREAD is applied to the memory cell 100. That is, a sensing circuit senses the data of the memory cell 100 in response to the sensing enable signal SEN_EN.

When the read voltage VREAD is applied to the memory cell 100 having the low resistance state SET and the memory cell 100 is turned on, the amount of the current flowing through the memory cell 100 may be drastically increased. The resistance value of the resistive memory device M of the memory cell 100 may vary with the increased amount of the current. Also, the increased amount of the current flowing through the memory cell 100 may lead to a relatively large amount of power consumption in performing the read operation.

Figure 4A:
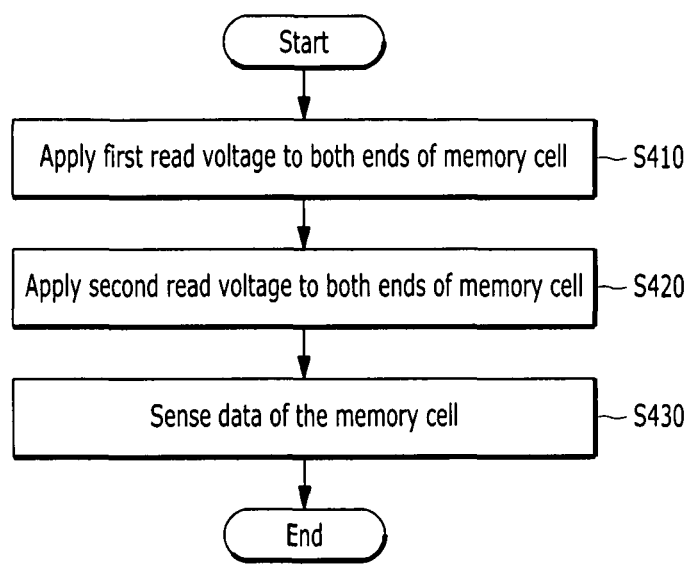
FIGS. 4A and 4B illustrate a read operation of the memory cell show in FIG. 1 in accordance with another implementation of the present disclosure.
Figure 4B:
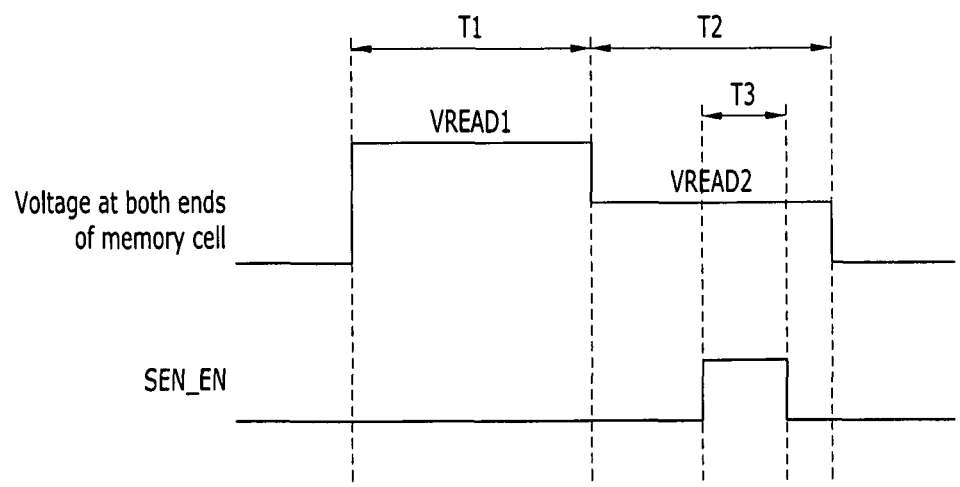

FIGS. 4A and 4B illustrate a read operation of the memory cell 100 of FIG. 1 in accordance with another implementation of the present disclosure. FIG. 4A is a flowchart illustrating a process of performing the read operation on the memory cell 100, and FIG. 4B illustrates example waveforms of a first read voltage VREAD1 and a second read voltage VREAD2 applied to the memory cell 100 and a sensing enable signal SEN_EN, during the read operation.

Referring to FIGS. 4A and 4B, at S410, the first read voltage VREAD1 may be applied to the both ends of the memory cell 100 during a first time interval T1. In an embodiment, the first read voltage VREAD1 may have a value substantially the same as a value of the read voltage VREAD of FIGS. 3A and 3B. For example, the first read voltage VREAD1 may have a value that is greater than a first threshold voltage (e.g., the first threshold value SET_Vth of FIG. 2) and smaller than a second the threshold value (e.g., the second threshold voltage RESET_Vth of FIG. 2).

When the first read voltage VREAD1 is applied to the memory cell 100 and the resistive memory device M of the memory cell 100 has the low resistance state SET, the memory cell 100 may be turned on, and the snapback phenomenon may occur. Thus, a current flowing through the memory cell 100 may have a relatively large amount.

In contrast, when the first read voltage VREAD1 is applied to the memory cell 100 and the resistive memory device M of the memory cell 100 has the high resistance state RESET, the memory cell 100 may not be turned on, and the snapback phenomenon may not occur. Thus, the current flowing through the memory cell 100 may have a relatively small amount. FIG. 4B shows that the first read voltage VREAD1 is applied to the memory cell 100 during the first time interval T1.

Subsequently, at S420, a second read voltage VREAD2 having a value smaller than the first read voltage VREAD1 may be applied to the both ends of the memory cell 100 during a second time interval T2.

When the memory cell 100 has been turned on during the first time interval T1 at S410, the memory cell 100 may remain turned on during the second time interval T2 when the second read voltage VREAD2 is applied at S420. In order to keep the memory cell 100 turned on during the second time interval T2, the second read voltage VREAD2 may be higher than a given voltage (e.g., a turn-off voltage Vh of FIG. 2), which has a value sufficiently low to turn off the memory cell 100. In contrast, when the memory cell 100 has been turned off during the first time interval T1 at S410, the memory cell 100 may remain turned off during the second time interval T2 when the second read voltage VREAD2 is applied at S420. Referring to FIG. 4B, the second read voltage VREAD2 is applied to the memory cell 100 during the second time interval T2 subsequent to the first time interval T1.

While the second read voltage VREAD2 is applied to the both ends of the memory cell 100 during the second time interval T2, the data stored in the memory cell 100 may be sensed during a third time interval T3 at S430. The data may be sensed according to the amount of the current flowing through the memory cell 100. When the amount of the current flowing through the memory cell 100 is relatively large, the resistive memory device M has the low resistance state SET. When the amount of the current flowing through the memory cell 100 is relatively small, the resistive memory device M has the high resistance state RESET.

Referring to FIG. 4B, the data of the memory cell 100 may be sensed when the sensing enable signal SEN_EN is enabled to have a specific logic value (e.g., a logic high value) while the second read voltage VREAD2 is applied to the memory cell 100. In an implementation, a sensing circuit (e.g., a sensing circuit 630 of FIG. 6) senses the data of the memory cell 100 in response to the sensing enable signal SEN_EN.

According to the read operation of FIGS. 4A and 4B, after the first read voltage VREAD1 is applied to the both ends of the memory cell 100, the second read voltage VREAD2 having a value lower than the first read voltage VREAD1 may be applied to the both ends of the memory cell 100. While the second read voltage VREAD2 is applied, the data stored in the memory cell 100 may be sensed. Because the smaller amount of the current flows through the selection device when the second read voltage VREAD2 is applied compared to when the first read voltage VREAD1 is applied, an amount of power consumption during the read operation may be reduced. In addition, the decrease in the amount of the current may prevent the resistance value of the resistive memory device M of the memory cell 100 from changing due to an excessive current flowing through the memory cell 100 during the read operation.

Figure 5:
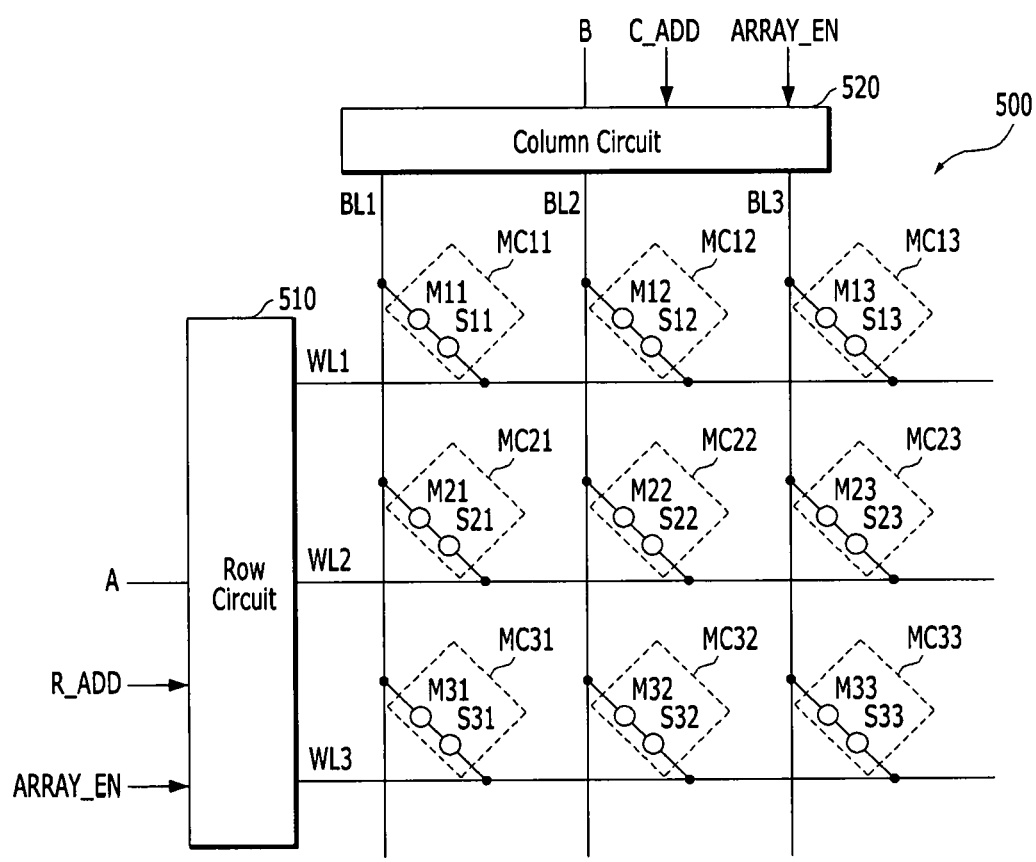
FIG. 5 is a block diagram illustrating a cell array of a semiconductor memory device in accordance with an implementation of the present disclosure.

FIG. 5 is a block diagram illustrating a cell array 500 of a semiconductor memory device in accordance with an implementation of the present disclosure.

Referring to FIG. 5, the cell array 500 may include a plurality of row lines (e.g., a plurality of word lines WL1 to WL3), a plurality of column lines (e.g., a plurality of bit lines BL1 to BL3), and memory cells MC11 to MC33 that are respectively disposed at cross points of the word lines WL1 to WL3 and the bit lines BL1 to BL3. Also, the cell array 500 may include a row circuit 510 and a column circuit 520 for respectively controlling the word lines WL1 to WL3 and the bit lines BL1 to BL3. Although the cell array 500 shown in FIG. 5 includes the row lines referred to as the word lines and the column lines referred to as the bit lines, in another implementation, the column lines may be referred to as the word lines, and the row lines may be referred to as the bit lines.

The memory cells MC11 to MC33 may include respective resistive memory devices M11 to M33 and respective selection devices S11 to S33. Each of the resistive memory devices M11 to M33 may have a low-resistance state or a high-resistance state according to data stored therein. In an implementation, each of the resistive memory devices M11 to M33 may be a phase-change memory device. When the phase-change memory device is in a crystalline state, the phase-change memory device has a low-resistance state. When the phase-change memory device is in an amorphous state, the phase-change memory device has a high-resistance state. When one of the selection devices S11 to S33 is turned off, a current having a relatively small amount flows through the selection device. When the amount of the current flowing through the selection device exceeds a value of a threshold current (e.g., the threshold current Ith of FIG. 2), the selection device may be turned on. As a result, the current having a relatively large amount may flow through the selection device compared to the current flowing through the selection device when the selection device is turned off. The selection devices S11 to S33 may be Ovonic Threshold Switch (OTS) devices.

The row circuit 510 may select one of the word lines WL1 to WL3 based on a row address R_ADD, and may couple the selected word line to a first node A. The column circuit 520 may select one of the bit lines BL1 to BL3 based on a column address C_ADD, and may couple the selected bit line to a second node B. A selected memory cell may be connected to the selected word line and the selected bit line.

For example, when a second word line WL2 and a second bit line BL2 are selected, a memory cell MC22 is selected. A first end of the selected memory cell MC22 may be electrically coupled to the first node A by the row circuit 510, and a second end of the selected memory cell may be electrically coupled to the second node B by the column circuit 520. Meanwhile, the row circuit 510 and the column circuit 520 may apply appropriate voltages to unselected word lines WL1 and WL3 and unselected bit lines BL1 and BL3 to keep selection devices S11, S12, S13, S21, S23, S31, S32, and S33 of unselected memory cells MC11, MC12, MC13, MC21, MC23, MC31, MC32, and MC33 turned off.

For example, while a first read voltage (e.g., the first read voltage VREAD1 of FIG. 4B) is applied to both ends of the selected memory cell MC22, a first voltage having a level that is equal to or lower than a half of a level of the first read voltage VREAD1 may be applied to both ends of each of the unselected memory cells MC11 to MC21 and MC23 to MC33. While a second read voltage (e.g., the second read voltage VREAD2 of FIG. 4B) is applied to the both ends of the selected memory cell MC22, a second voltage having a level that is equal to or lower than a half of a level of the second read voltage VREAD2 may be applied to the both ends of each of the unselected memory cells MC11 to MC21 and MC23 to MC33. In an implementation, the level of the second voltage is lower than the level of the first voltage.

A cell array enable signal ARRAY_EN activates the row circuit 510 and the column circuit 520. When the cell array enable signal ARRAY_EN is enabled to have a first logic value (e.g., a logic high value), the row circuit 510 and the column circuit 520 may operate as described above. When the cell array enable signal ARRAY_EN is disabled to have a second logic value (e.g., a logic low value), the row circuit 510 and the column circuit 520 may apply the same voltage (e.g., a ground voltage) to all the word lines WL1 to WL3 and all the bit lines BL1 to BL3, or may cause all the word lines WL1 to WL3 and all the bit lines BL1 to BL3 to float.

Although the cell array 500 shown in FIG. 5 includes the three word lines WL1 to WL3 and the three bit lines BL1 to BL3, implementations of the present disclosure are not limited thereto. In other implementations, more than three word lines and more than three bit lines may be included in the cell array 500.

Figure 6:
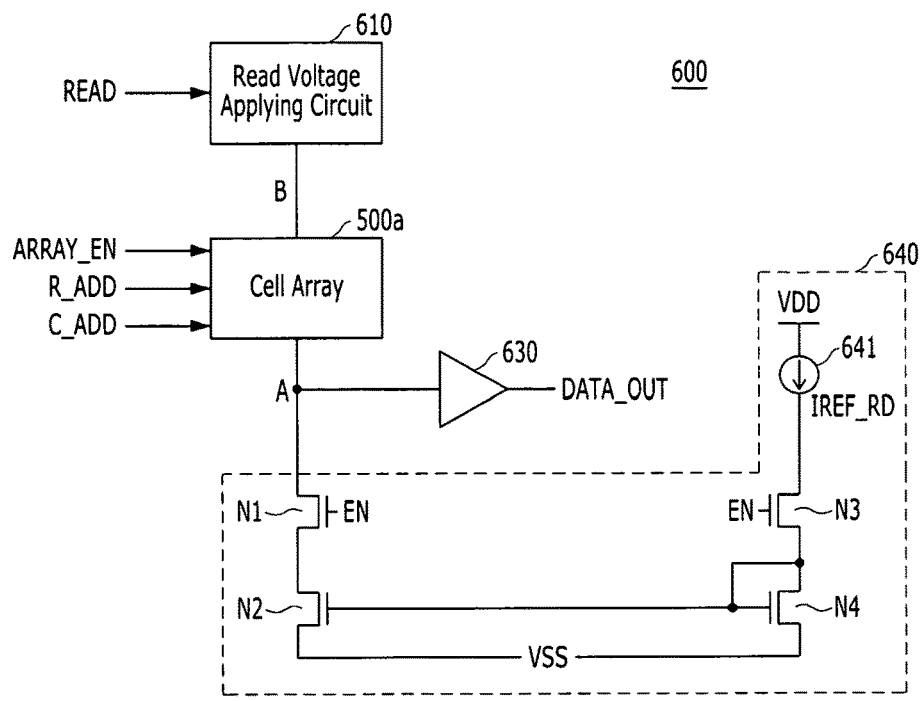
FIG. 6 illustrates a semiconductor memory device in accordance with an implementation of the present disclosure.

FIG. 6 illustrates a semiconductor memory device 600 in accordance with an implementation of the present disclosure.

Referring to FIG. 6, the semiconductor memory device 600 may include a cell array 500a, a read voltage applying circuit 610, a sensing circuit 630, and a current clamping circuit 640.

The cell array 500a may include a plurality of memory cells (e.g., the plurality of memory cells MC11 to MC33 of FIG. 5) that are arrayed in a plurality of columns and a plurality of rows as described above with reference to FIG. 5. When a cell array enable signal ARRAY_EN is enabled, a memory cell, which is selected based on a row address R_ADD and a column address C_ADD among the plurality of memory cells of the cell array 500a, may be electrically coupled to a first node A and a second node B.

The read voltage applying circuit 610 may apply a first read voltage (e.g., a first read voltage VREAD1 of FIG. 7) to the selected memory cell during a read operation. After the first read voltage VREAD1 is applied to the selected memory cell, the read voltage applying circuit 610 may apply a second read voltage (e.g., a second read voltage VREAD2 of FIG. 7) to the selected memory cell. The read voltage applying circuit 610 may apply the first read voltage VREAD1 and the second read voltage VREAD2 to the selected memory cell through the second node B. The read voltage applying circuit 610 may sequentially apply the first read voltage VREAD1 and the second read voltage VREAD2 to the second node B, when a read signal READ is enabled during the read operation.

The current clamping circuit 640 may copy a read reference current IREF_RD and sink the copied current from the first node A when an enable signal EN is enabled to have a first logic value (e.g., a logic high value). When a resistive memory device of the selected memory cell has a high resistance state, the read reference current IREF_RD may have a greater amount than a current flowing through the selected memory cell. When the selected memory cell is turned off, the read reference current IREF_RD may have a greater amount than the current flowing through the selected memory cell.

On the other hand, when the resistive memory device of the selected memory cell has a low resistance state, the read reference current IREF_RD may have a smaller amount than the current flowing through the selected memory cell. When the selected memory cell is turned on, the read reference current IREF_RD may have a smaller amount than the current flowing through the selected memory cell.

The current clamping circuit 640 may include NMOS transistors N1 and N3 used for activating or deactivating the current clamping circuit 640 in response to the enable signal EN, a current source 641 supplying the read reference current IREF_RD, and NMOS transistors N2 and N4 used for copying the read reference current IREF_RD to the current flowing from the first node A.

The sensing circuit 630 may sense data stored in the selected memory cell by sensing the amount of the current flowing through the selected memory cell in the cell array 500a. When the resistive memory device of the selected memory cell has the low resistance state and thus the selected memory cell is turned on, the amount of the current flowing through the selected memory cell is greater than the amount of the read reference current IREF_RD, thereby increasing a level of a voltage at the first node A. On the other hand, when the resistive memory device of the selected memory cell has the high resistance state and thus the selected memory cell is turned off, the amount of the current flowing through the selected memory cell is smaller than the amount of the read reference current IREF_RD, such that the voltage level at the first node A becomes a low level (e.g., a ground voltage VSS).

The sensing circuit 630 may detect the amount of the current flowing through the selected memory cell by sensing the voltage level at the first node A. The sensing circuit 630 may be activated according to a sensing enable signal SEN_EN.

Figure 7:
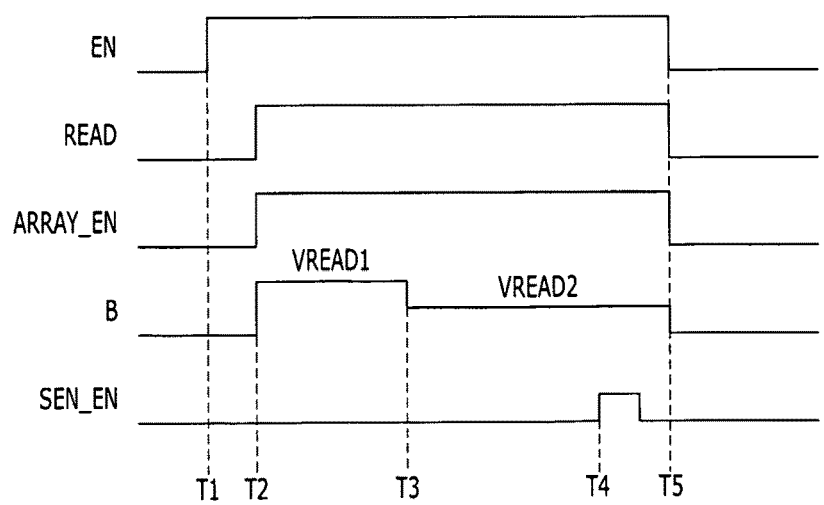
FIG. 7 is a timing diagram illustrating a read operation of the semiconductor memory device shown in FIG. 6.

FIG. 7 is a timing diagram illustrating the read operation of the semiconductor memory device 600 shown in FIG. 6. Referring to FIGS. 6 and 7, the read operation of the semiconductor memory device 600 will be described below.

Referring to FIG. 7, at a first time T1, the enable signal EN is enabled to have a first logic value (e.g., a logic high value), thereby activating the current clamping circuit 640. Thus, the voltage at the first node A of FIG. 6 may be initialized to a level that is substantially equal to a ground voltage VSS.

At a second time T2, the read signal READ and the cell array enable signal ARRAY_EN may be enabled to have a first logic value (e.g., a logic high value). When the cell array enable signal ARRAY_EN is enabled, first and second ends of the selected memory cell may be respectively coupled to the first node A and the second node B in the cell array 500a. The read voltage applying circuit 610 may provide the first read voltage VREAD1 to the second node B to apply the first read voltage VREAD1 to the selected memory cell at the second time T2. In response to the applied first read voltage VREAD1, the selected memory cell may be turned on or off according to data stored therein. For example, when the resistive memory device of the selected memory cell has a low resistance state, a voltage across the selection device of the selected memory cell is sufficiently high to turn on the selection device. When the resistive memory device of the selected memory cell has a high resistance state, a voltage across the selection device of the selected memory cell is not sufficiently high to turn on the selection device, and thus the selection device remains turned off. At a third time T3, the read voltage applying circuit 610 may provide the second read voltage VREAD2 having a lower level than the first read voltage VREAD1 to the second node B. When the selected memory cell has been turned on during a first time interval between the second time T2 and the third time T3, the selected memory cell may remain turned on during a second time interval between the third time T3 and a fifth time T5 when the second read voltage VREAD2 is applied to the selected memory cell. On the other hand, when the selected memory cell has been turned off during the first time interval between the second time T2 and the third time T3, the selected memory cell may remain turned off during the second time interval when the second read voltage VREAD2 is applied to the selected memory cell.

While the second read voltage VREAD2 is applied to the selected memory cell through the second node B, at a fourth time T4, a sensing enable signal SEN_EN may be enabled to have a first logic value (e.g., a logic high value) and the data stored in the selected memory cell may be sensed by the sensing circuit 630. After the data is sensed, at the fifth time T5, the enable signal EN, the read signal READ, and the cell array enable signal ARRAY_EN may be disabled to have a second logic value (e.g., a logic low value) and the read operation may end.

The memory circuit or semiconductor device in accordance with the implementation of the present disclosure may be applied to diverse devices or systems. FIGS. 8 to 12 illustrate devices or systems that may be realized by using the memory circuit or the semiconductor device in accordance with the implementation of the present disclosure.

Figure 8:
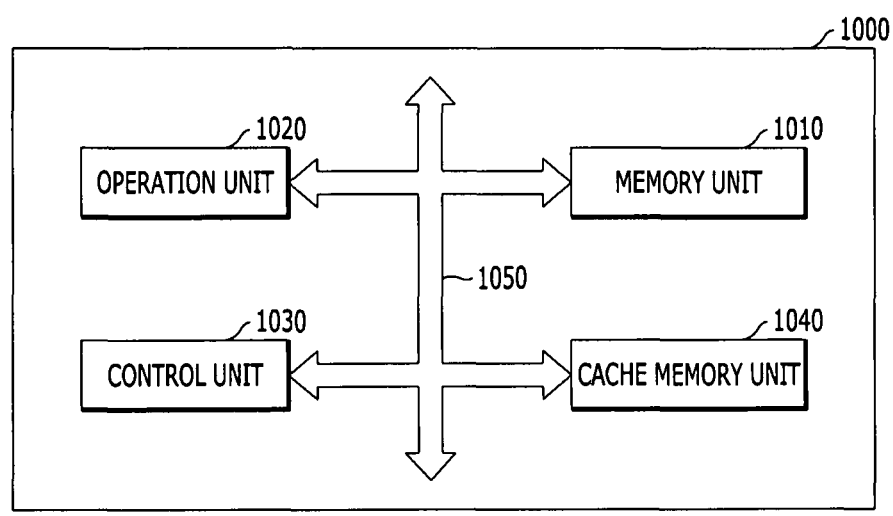
FIG. 8 is a block diagram illustrating a micro-processor implementing memory device based on the disclosed technology.

FIG. 8 is a block diagram illustrating a micro-processor 1000 implementing memory device based on the disclosed technology.

Referring to FIG. 8, the micro-processor 1000 may be able to receive and process data from diverse external devices and then control a series of processes for transferring the process result to an external device. The micro-processor 1000 may include a memory unit 1010, an operation unit 1020, and a control unit 1030. The micro-processor 1000 may be diverse data processing devices, such as a Central Processing Unit (CPU), a Graphic Processing Unit (GPU), a Digital Signal Processor (DSP), an Application Processor (AP) and so forth.

The memory unit 1010 may be a portion of storing data in the inside of the micro-processor 1000, and the memory unit 1010 may include a data register, an address register, a floating point register and other diverse registers. Non-limiting examples of the memory unit 1010 may include a processor register and a register. The memory unit 1010 may temporarily store data for performing an operation in the operation unit 1020, operation result data, and addresses for the data for performing the operation.

The memory unit 1010 may include one or more of the semiconductor devices in accordance with the implementations of the present disclosure, which are described above. For example, the memory unit 1010 may include a resistive memory device that may have a high resistance state and a low resistance state according to the data that is stored therein, and a memory cell which includes a selection device that is serially coupled to the resistive memory device. A first read voltage may be applied to both ends of the memory cell, and then a second read voltage which is lower than the first read voltage may be applied. While the second read voltage is applied, the data of the memory cell may be sensed. In this way, read operation characteristics may be improved. Consequently, the read operation characteristics of the micro-processor 1000 may be improved.

The operation unit 1020 may perform four fundamental rules of arithmetics or logic operations according to a command analysis result which is obtained by the control unit 1030. The operation unit 1020 may include one or more arithmetic and logic units (ALU).

The control unit 1030 may receive signals from the memory unit 1010, the operation unit 1020, and an external device of the micro-processor 1000, extract or decrypt a command, and control input/output signals to/from the micro-processor 1000, and execute a process which is realized as a program.

The micro-processor 1000 in accordance with the embodiment of the present invention may further include a cache memory unit 1040 capable of temporarily storing a data to be inputted from an external device other than the memory unit 1010 or outputted to an external device other than the memory unit 1010. In this case, the cache memory unit 1040 may transfer and receive data to and from the memory unit 1010, the operation unit 1020, and the control unit 1030 through a bus interface 1050.

Figure 9:
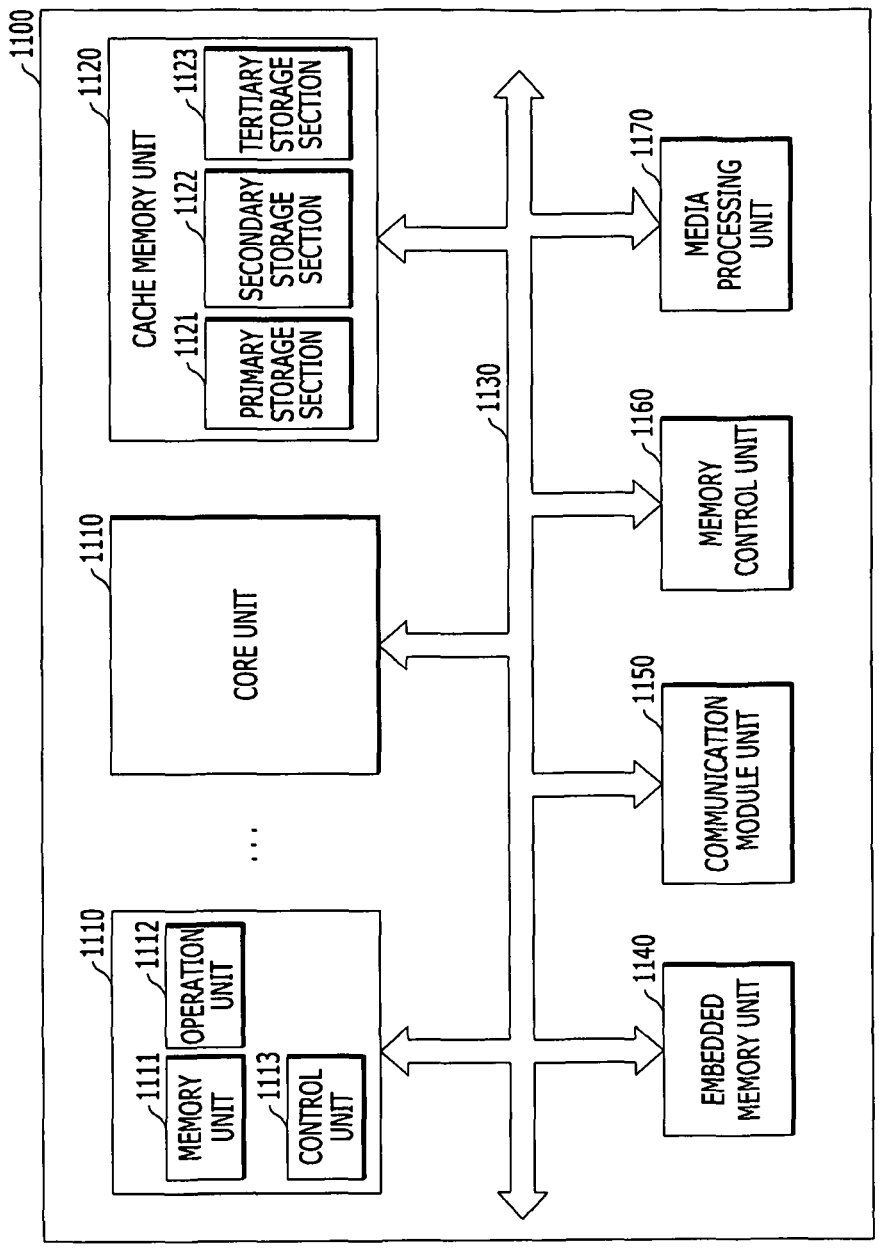
FIG. 9 is a block diagram illustrating a processor implementing memory device based on the disclosed technology.

FIG. 9 is a block diagram illustrating a processor 1100 implementing memory device based on the disclosed technology.

Referring to FIG. 9, the processor 1100 may include diverse functions other than the functions of a micro-processor which include receiving and processing data from diverse external devices and then controlling a series of processes for transferring the process result to an external device, and improve the performance and realize diverse functions. The processor 1100 may include a core unit 1110 which functions as a micro-processor, a cache memory unit 1120 which temporarily stores data, and a bus interface 1130 which transfers data between an internal device and an external device. The processor 1100 may include diverse System-On Chips (SoC), such as a multi-core processor, a Graphic Processing Unit (GPU), an Application Processor (AP) and the like.

The core unit 1110 of the processor 1100 in accordance with the implementation of the present disclosure may be a constituent element for performing an arithmetic and logic operations onto a data inputted from an external device. The core unit 1110 may include a memory unit 1111, an operation unit 1112, and a control unit 1113.

The memory unit 1111 may be a processor register or a register. The memory unit 1111 may be a constituent element for storing data in the processor 1100. The memory unit 1111 may include a data register, an address register, a floating point register, and other diverse registers. The memory unit 1111 may temporarily store data for performing an operation in the operation unit 1112, operation result data, and addresses for the data for performing the operation.

The operation unit 1112 may be a constituent element for performing an operation in the inside of the processor 1100. The operation unit 1112 may perform four fundamental rules of arithmetics or logic operations according to a command analysis result which is obtained by the control unit 1113. The operation unit 1112 may include one or more arithmetic and logic units (ALU).

The control unit 1113 may receive signals from the memory unit 1111, the operation unit 1112, and an external device of the processor 1100, extract or decrypt a command, and control input/output signals to/from the processor 1100, and execute a process which is realized as a program.

The cache memory unit 1120 may be a constituent element for temporarily storing data to complement the difference between the data processing rates of the core unit 1110 that performs at a high speed and an external device that performs at a low speed. The cache memory unit 1120 may include a primary storage section 1121, a secondary storage section 1122, and a tertiary storage section 1123. Generally, the cache memory unit 1120 may include the primary storage section 1121 and the secondary storage section 1122, and when high capacity is required, the cache memory unit 1120 may include the tertiary storage section 1123. If necessary, the cache memory unit 1120 may include more storage sections. In short, the number of the storage sections that are included by the cache memory unit 1120 may be different according to how it is designed. Herein, the speed that data are stored in the primary storage section 1121, the secondary storage section 1122, and the tertiary storage section 1123 and the decision processing speed may be the same or different. When the processing speed of each storage section is different, the processing speed of the primary storage section 1121 may be fastest. One or more storage sections among the primary storage section 1121, the secondary storage section 1122, and the tertiary storage section 1123 of the cache memory unit 1120 may include one or more semiconductor devices among the semiconductor devices in accordance with the above-described implementations of the present disclosure. For example, the cache memory unit 1120 may include a resistive memory device that has a high resistance state and a low resistance state according to the data that is stored therein, and a memory cell which includes a selection device that is serially coupled to the resistive memory device. A first read voltage may be applied to both ends of the memory cell, and then a second read voltage which is lower than the first read voltage may be applied. While the second read voltage is applied, the data of the memory cell may be sensed. In this way, read operation characteristics of the cache memory unit 1120 may be improved. Consequently, the read operation characteristics of the processor 1100 may be improved.

Although FIG. 9 shows a case that the primary storage section 1121, the secondary storage section 1122, and the tertiary storage section 1123 are all included in the inside of the cache memory unit 1120, the primary storage section 1121, the secondary storage section 1122, and the tertiary storage section 1123 of the cache memory unit 1120 may be all provided in the outside of the core unit 1110 to complement the difference in the processing speeds between the core unit 1110 and an external device. Also, the primary storage section 1121 of the cache memory unit 1120 may be disposed in the inside of the core unit 1110, while the secondary storage section 1122 and the tertiary storage section 1123 may be disposed in the outside of the core unit 1110 to complement the difference in the processing speeds between the core unit 1110 and the external device even more. Also, the primary storage section 1121 and the secondary storage section 1122 may be disposed in the inside of the core unit 1110 while the tertiary storage section 1123 may be disposed in the outside of the core unit 1110.

The bus interface 1130 may be a constituent element for efficiently transferring data by coupling the core unit 1110, the cache memory unit 1120, and the external device.

In accordance with the implementation of the present disclosure, the processor 1100 may include a plurality of the core units 1110, and the core units 1110 may share the cache memory unit 1120. The core units 1110 and the cache memory unit 1120 may be directly coupled to each other, or coupled to each other through the bus interface 1130. The core units 1110 may be formed to have the same structure of the core unit 1110, which is described above. When the processor 1100 includes the multiple core units 1110, the primary storage section 1121 of the cache memory unit 1120 may be formed in the inside of each of the core units 1110, and the secondary storage section 1122 and the tertiary storage section 1123 may be formed in the outside of the core units 1110 to be shared through the bus interface 1130. Herein, the processing speed of the primary storage section 1121 may be faster than the processing speeds of the secondary storage section 1122 and the tertiary storage section 1123. In accordance with another implementation of the present disclosure, the primary storage section 1121 and the secondary storage section 1122 may be formed in each of the core units 1110, and the tertiary storage section 1123 may be formed in the outside of the core units 1110 to be shared through the bus interface 1130.

In accordance with the implementation of the present disclosure, the processor 1100 may further include an embedded memory unit 1140 which stores data, a communication module unit 1150 which transfers/receives data to/from an external device through wire or wirelessly, a memory control unit 1160 which operates an external memory device, and a media processing unit 1170 which processes and outputs data processed by the processor 1100 or data inputted from an external input device to an external interface device. Besides, the processor 1100 may further include a plurality of modules and devices. In this case, the additionally included modules may transfer/receive data to/from the core unit 1110 and the cache memory unit 1120 through the bus interface 1130.

Herein, the embedded memory unit 1140 may include not only a volatile memory but also a non-volatile memory. Non-limiting examples of the volatile memory may include a Dynamic Random Access Memory (DRAM), a mobile DRAM, a Static Random Access Memory (SRAM), and memories capable of performing similar functions. Non-limiting examples of the non-volatile memory may include a Read Only Memory (ROM), a NOR flash memory, a NAND flash memory, a Phase-change Random Access Memory (PRAM), a Resistive Random Access Memory (RRAM), a Spin Transfer Torque Random Access Memory (STTRAM), a Magnetic Random Access Memory (MRAM), and memories capable of performing similar functions.

The communication module unit 1150 may include a module that may be coupled to a wired network, a module that may be coupled to a wireless network, and all of them. Non-limiting examples of the wired network may include diverse devices that transfer/receive data through a transfer line, a Local Area Network (LAN), a Universal Serial Bus (USB), an Ethernet, a Power Line Communication (PLC) and so forth. Non-limiting examples of the wireless network may include diverse devices that transfer/receive data without a transfer line, an Infrared Data Association (IrDA), a Code Division Multiple Access (CDMA), a Time Division Multiple Access (TDMA), a Frequency Division Multiple Access (FDMA), a Wireless LAN, Zigbee, a Ubiquitous Sensor Network (USN), a Bluetooth, a Radio Frequency Identification (RFID), a Long-Term Evolution (LTE), a Near Field Communication (NFC), a Wireless Broadband Internet (Wibro), a High-Speed Downlink Packet Access (HSDPA), a Wideband CDMA (WCDMA), an Ultra WideBand (UWB) and the like.

The memory control unit 1160 may be a constituent element for processing and managing data that are transferred between the processor 1100 and an external storage device that operate based one different communication protocols. Non-limiting examples of the memory control unit 1160 may include diverse memory controllers, such as controllers that controls an Integrated Device Electronics (IDE), a Serial Advanced Technology Attachment (SATA), a Small Computer System Interface (SCSI), a Redundant Array of Independent Disks (RAID), a Solid State Disk (SSD), an External SATA (eSATA), a Personal Computer Memory Card International Association (PCMCIA), a Universal Serial Bus (USB), a Secure Digital (SD), a mini Secure Digital card (mSD), a micro SD, a Secure Digital High Capacity (SDHC), a Memory Stick Card, a Smart Media Card (SM), a Multi Media Card (MMC), an Embedded MMC (eMMC), a Compact Flash (CF) and the like.

The media processing unit 1170 may be able to process data that are processed by the processor 1100 and data that are inputted from an external input device in the form of video data and voice data, and output the data to an external interface device. Non-limiting examples of the media processing unit 1170 may include a Graphics Processing Unit (GPU), a Digital Signal Processor (DSP), a High Definition Audio (HD Audio), a High Definition Multimedia Interface (HDMI) controller and so forth.

Figure 10:
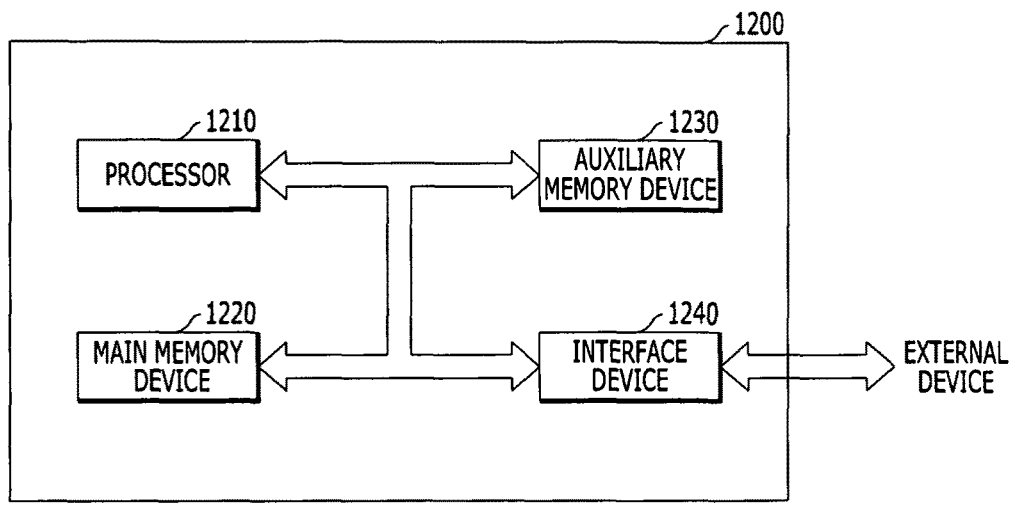
FIG. 10 is a block diagram illustrating a system implementing memory device based on the disclosed technology.

FIG. 10 is a block diagram illustrating a system 1200 implementing memory device based on the disclosed technology.

Referring to FIG. 10, the system 1200 may be a device that processes data, and the system 1200 may perform such operations of inputting, processing, outputting, communicating, and storing data to perform a series of operations onto the data. The system 1200 may include a processor 1210, a main memory device 1220, an auxiliary memory device 1230, and an interface device 1240. In accordance with the implementation of the present disclosure, the system 1200 may be diverse electronic systems that operate based on a process, such as a computer, a server, a Personal Digital Assistant (PDA), a portable computer, a web tablet, a wireless phone, a mobile phone, a smart phone, a digital music player, a Portable Multimedia Player (PMP), a camera, a Global Positioning System (GPS), a video camera, a voice recorder, telematics, an Audio Visual (AV) system, a smart television and the like.

The processor 1210 may be able to control analyzing an inputted command and performing such processes as operation and comparison onto the data stored in the system 1200, and the processor 1210 may include a Micro Processor Unit (MPU), a Central Processing Unit (CPU), a Single/Multi Core Processor, a Graphic Processing Unit (GPU), an Application Processor (AP), a Digital Signal Processor (DSP) and the like.

The main memory device 1220 may be a memory space where a program code or a data is transferred from the auxiliary memory device 1230 and stored and executed, when a program is implemented. Even when a power source is cut off, the main memory device 1220 may retain the program code or the data. The main memory device 1220 may include one or more semiconductor devices in accordance with the implementations of the present disclosure. For example, the main memory device 1220 may include a resistive memory device that has a high resistance state and a low resistance state according to the data that is stored therein, and a memory cell which includes a selection device that is serially coupled to the resistive memory device. A first read voltage may be applied to both ends of the memory cell, and then a second read voltage which is lower than the first read voltage may be applied. While the second read voltage is applied, the data of the memory cell may be sensed. In this way, read operation characteristics of the main memory device 1220 may be improved. Consequently, the read operation characteristics of the system 1200 may be improved.

Also, the main memory device 1220 may further include a volatile memory whose data are all erased when a power source is turned off, such as a Static Random Access Memory (SRAM) and a Dynamic Random Access Memory (DRAM). Also, the main memory device 1220 may not include the semiconductor device in accordance with the implementation of the present disclosure but include a volatile memory whose data are all erased when a power source is turned off, such as a Static Random Access Memory (SRAM) and a Dynamic Random Access Memory (DRAM).

The auxiliary memory device 1230 may be a memory device that retains a program code or a data. The auxiliary memory device 1230 may be able to store more data than the main memory device 1220, although the auxiliary memory device 1230 operates more slowly than the main memory device 1220 does. The auxiliary memory device 1230 may include one or more semiconductor devices in accordance with the implementations of the present disclosure.

For example, the auxiliary memory device 1230 may include a resistive memory device that has a high resistance state and a low resistance state according to the data that is stored therein, and a memory cell which includes a selection device that is serially coupled to the resistive memory device. A first read voltage may be applied to both ends of the memory cell, and then a second read voltage which is lower than the first read voltage may be applied. While the second read voltage is applied, the data of the memory cell may be sensed. In this way, read operation characteristics of the auxiliary memory device 1230 may be improved. Consequently, the read operation characteristics of the system 1200 may be improved.

Also, the auxiliary memory device 1230 may further include a data storing system (see a reference numeral '1300' of FIG. 9), such as a magnetic tape using magnetism, a magnetic disk, a laser disk using light, a magneto-optical disk using two of them, a Solid-State Disk (SSD), a Universal Serial Bus Memory (USB Memory), a Secure Digital (SD), a mini Secure Digital card (mSD), a micro SD, a Secure Digital High Capacity (SDHC) card, a Memory Stick Card, a Smart Media Card (SM), a Multi-Media Card (MMC), an Embedded MMC (eMMC), a Compact Flash (CF) card and the like. Also, the auxiliary memory device 1230 may not include the semiconductor device in accordance with the implementation of the present disclosure but include a data storing system (see a reference numeral '1300' of FIG. 9), such as a magnetic tape using magnetism, a magnetic disk, a laser disk using light, a magneto-optical disk using two of them, a Solid-State Disk (SSD), a Universal Serial Bus Memory (USB Memory), a Secure Digital (SD), a mini Secure Digital card (mSD), a micro SD, a Secure Digital High Capacity (SDHC) card, a Memory Stick Card, a Smart Media Card (SM), a Multi-Media Card (MMC), an Embedded MMC (eMMC), a Compact Flash (CF) card and the like.

The interface device 1240 may be a device that exchanges a command and/or a data between the system 1200 and an external device. Non-limiting examples of the interface device 1240 may include a keypad, a keyboard, a mouse, a speaker, a mike, a display device, diverse Human Interface Devices (HID), a communication device and so forth. The communication device may include a module that may be connected to a wired network, a module that may be connected to a wireless network, or all of them. Non-limiting examples of the wired network may include diverse devices that transfer/receive data through a transfer line, such as a Local Area Network (LAN), a Universal Serial Bus (USB), an Ethernet, a Power Line Communication (PLC) and so forth. Non-limiting examples of the wireless network may include diverse devices that transfer/receive data without a transfer line, such as an Infrared Data Association (IrDA), a Code Division Multiple Access (CDMA), a Time Division Multiple Access (TDMA), a Frequency Division Multiple Access (FDMA), a wireless LAN, Zigbee, a Ubiquitous Sensor Network (USN), Bluetooth, a Radio Frequency IDentification (RFID), a Long-Term Evolution (LTE), a Near Field Communication (NFC), a Wireless Broadband Internet (Wibro), a High Speed Downlink Packet Access (HSDPA), a Wideband CDMA (WCDMA), an Ultra WideBand (UWB) and so forth.

Figure 11:
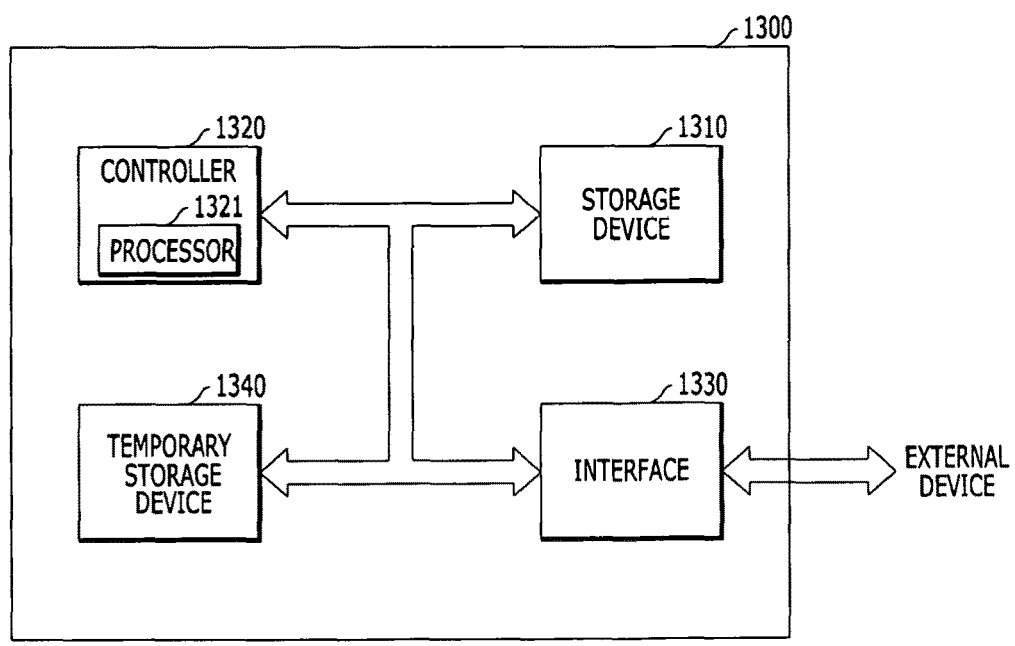
FIG. 11 is a block diagram illustrating a data storing system implementing memory device based on the disclosed technology.

FIG. 11 is a block diagram illustrating a data storing system 1300 implementing memory device based on the disclosed technology.

Referring to FIG. 11, the data storing system 1300 may include a storage device 1310 which is a constituent element for storing data and has non-volatile characteristics, a controller 1320 which controls the storage device 1310, an interface 1330 which is a constituent element for connection to an external device, and a temporary storage device 1340 which temporarily stores data. The data storing system 1300 may be of a disk type, such as, a Hard Disk Drive (HDD), a Compact Disc Read Only Memory (CDROM), a Digital Versatile Disc (DVD), a Solid-State Disk (SSD) and the like, or of a card type, such as a Universal Serial Bus Memory (USB Memory), a Secure Digital (SD), a mini Secure Digital card (mSD), a micro SD, a Secure Digital High Capacity (SDHC) card, a Memory Stick Card, a Smart Media Card (SM), a Multi-Media Card (MMC), an Embedded MMC (eMMC), a Compact Flash (CF) card and the like.

The storage device 1310 may include a non-volatile memory that may store data semi-permanently. The non-volatile memory may include a Read Only Memory (ROM), a NOR flash memory, a NAND flash memory, a Phase-change Random Access Memory (PRAM), a Resistive Random Access Memory (RRAM), a Magnetic Random Access Memory (MRAM) and the like.

The controller 1320 may be able to control the exchange of data between the storage device 1310 and the interface 1330. To this end, the controller 1320 may include a processor 1321 that may perform an operation for processing commands which are inputted through the interface 1330 from the outside of the data storing system 1300.

The interface 1330 may be a constituent element that exchanges commands and data between the data storing system 1300 and an external device. When the data storing system 1300 is of a card type, the interface 1330 may be compatible with interfaces that are used in such devices as a Universal Serial Bus Memory (USB Memory), a Secure Digital (SD), a mini Secure Digital card (mSD), a micro SD, a Secure Digital High Capacity (SDHC) card, a Memory Stick Card, a Smart Media Card (SM), a Multi-Media Card (MMC), an Embedded MMC (eMMC), a Compact Flash (CF) card and the like, or the interface 1330 may be compatible with interfaces that are used in similar devices. When the data storing system 1300 is of a disk type, the interface 1330 may be compatible with interfaces, such as an Integrated Device Electronics (IDE), a Serial Advanced Technology Attachment (SATA), a Small Computer System Interface (SCSI), an External SATA (eSATA), a Personal Computer Memory Card International Association (PCMCIA), a Universal Serial Bus (USB) and the like, or the interface 1330 may be compatible with interfaces that are similar to the above-named interfaces. The interface 1330 may be compatible with one or more interfaces of different types.

The temporary storage device 1340 may be able to temporarily store data to efficiently transfer data between the interface 1330 and the storage device 1310, as the interface with the external device, the controller, and the system become diverse and have high performance. The temporary storage device 1340 may be able to include one or more of the semiconductor devices in accordance with the implementations of the present disclosure. For example, the temporary storage device 1340 may include a resistive memory device that has a high resistance state and a low resistance state according to the data that is stored therein, and a memory cell which includes a selection device that is serially coupled to the resistive memory device. A first read voltage may be applied to both ends of the memory cell, and then a second read voltage which is lower than the first read voltage may be applied. While the second read voltage is applied, the data of the memory cell may be sensed. In this way, read operation characteristics of the temporary storage device 1340 may be improved. Consequently, the read operation characteristics of the data storing system 1300 may be improved.

Figure 12:
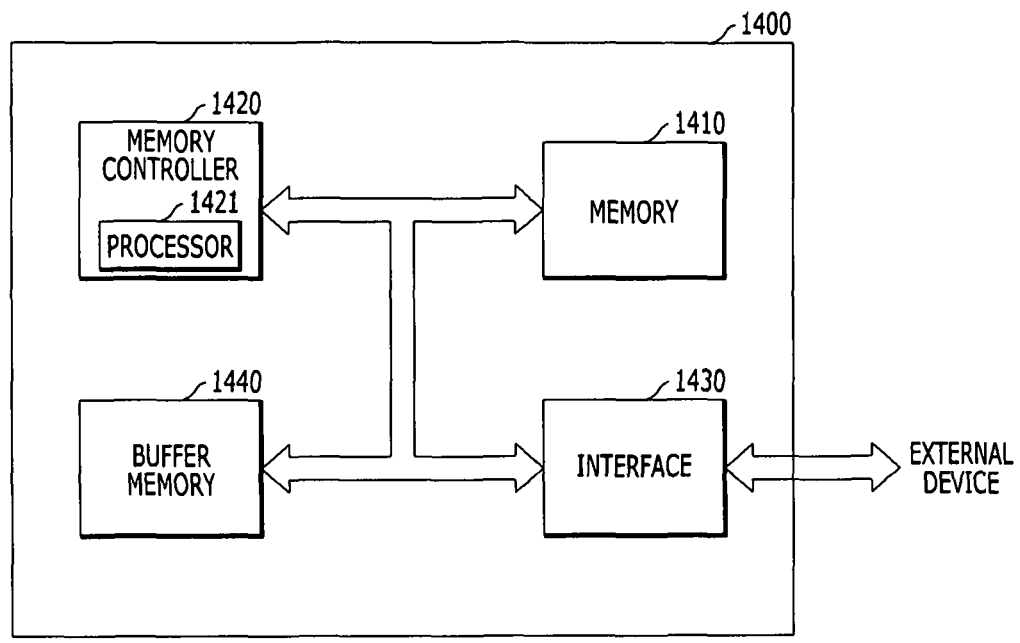
FIG. 12 is a block diagram illustrating a memory system implementing memory device based on the disclosed technology.

FIG. 12 is a block diagram illustrating a memory system 1400 implementing memory device based on the disclosed technology.

Referring to FIG. 12, the memory system 1400 may include a memory 1410 which is a constituent element for storing data and has volatile characteristics, a memory controller 1420 which controls the memory 1410, and an interface 1430 which is a constituent element for connection to an external device. The memory system 1400 may be of a card type, such as a Solid-State Disk (SSD), a Universal Serial Bus Memory (USB Memory), a Secure Digital (SD), a mini Secure Digital card (mSD), a micro SD, a Secure Digital High Capacity (SDHC) card, a Memory Stick Card, a Smart Media Card (SM), a Multi-Media Card (MMC), an Embedded MMC (eMMC), a Compact Flash (CF) card and the like.

The memory 1410 storing data may include one or more semiconductor devices in accordance with the implementations of the present disclosure. For example, the memory 1410 may include a resistive memory device that has a high resistance state and a low resistance state according to the data that is stored therein, and a memory cell which includes a selection device that is serially coupled to the resistive memory device. A first read voltage may be applied to both ends of the memory cell, and then a second read voltage which is lower than the first read voltage may be applied. While the second read voltage is applied, the data of the memory cell may be sensed. In this way, read operation characteristics of the memory 1410 may be improved. Consequently, the read operation characteristics of the memory system 1400 may be improved.

Also, the memory 1410 in accordance with the implementation of the present disclosure may include a Read Only Memory (ROM), a NOR flash memory, a NAND flash memory, a Phase-change Random Access Memory (PRAM), a Resistive Random Access Memory (RRAM), a Magnetic Random Access Memory (MRAM) and the like that have non-volatile characteristics.

The memory controller 1420 may be able to control the exchange of data between the memory 1410 and the interface 1430. To this end, the memory controller 1420 may include a processor 1421 that may perform an operation for processing commands which are inputted through the interface 1430 from the outside of the memory system 1400.

The interface 1430 may be a constituent element that exchanges commands and data between the memory system 1400 and an external device. The interface 1430 may be compatible with interfaces that are used in such devices as a Universal Serial Bus Memory (USB Memory), a Secure Digital (SD), a mini Secure Digital card (mSD), a micro SD, a Secure Digital High Capacity (SDHC) card, a Memory Stick Card, a Smart Media Card (SM), a Multi-Media Card (MMC), an Embedded MMC (eMMC), a Compact Flash (CF) card and the like, or the interface 1430 may be compatible with interfaces that are used in similar devices. The interface 1430 may be compatible with one or more interfaces of different types.

The memory system 1400 in accordance with the implementation of the present disclosure may further include a buffer memory 1440 which is a constituent element for efficiently transferring input/output data between the interface 1430 and the memory 1410, as the interface with the external device, the memory controller, and the memory system become diverse and have high performance. The buffer memory 1440 may be able to include one or more of the semiconductor devices in accordance with the implementations of the present disclosure. For example, the buffer memory 1440 may include a resistive memory device that has a high resistance state and a low resistance state according to the data that is stored therein, and a memory cell which includes a selection device that is serially coupled to the resistive memory device. A first read voltage may be applied to both ends of the memory cell, and then a second read voltage which is lower than the first read voltage may be applied. While the second read voltage is applied, the data of the memory cell may be sensed. In this way, read operation characteristics of the buffer memory 1440 may be improved. Consequently, the read operation characteristics of the memory system 1400 may be improved.

In addition, the buffer memory 1440 in accordance with the implementation of the present disclosure may be able to include volatile memories, such as a Static Random Access Memory (SRAM) and a Dynamic Random Access Memory (DRAM), and a non-volatile memories, such as a Read Only Memory (ROM), a NOR flash memory, a NAND flash memory, a Phase-change Random Access Memory (PRAM), a Resistive Random Access Memory (RRAM), a Spin Transfer Torque Random Access Memory (STTRAM), a Magnetic Random Access Memory (MRAM) and so forth. Also, the buffer memory 1440 may not include the semiconductor device in accordance with the implementation of the present disclosure but include a volatile memory, such as a Static Random Access Memory (SRAM) and a Dynamic Random Access Memory (DRAM), and a non-volatile memory, such as a Read Only Memory (ROM), a NOR flash memory, a NAND flash memory, a Phase-change Random Access Memory (PRAM), a Resistive Random Access Memory (RRAM), a Spin Transfer Torque Random Access Memory (STTRAM), a Magnetic Random Access Memory (MRAM) and so forth.

According to the implements of the present disclosure, it is possible to reduce the amount of current consumption of a read operation and perform a read operation more stably.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory, wherein the semiconductor memory comprises:
    a cell array comprising a plurality of memory cells that are arrayed in a plurality of columns and a plurality of rows;
    a read voltage applying circuit which applies a first read voltage to a memory cell selected among the plurality of memory cells in the cell array and applies a second read voltage to the selected memory cell, the second read voltage having a level lower than a level of the first read voltage;
    a sensing circuit which senses data stored in the selected memory cell while the second read voltage is applied to the selected memory cell; and
    a row circuit and a column circuit,
    wherein each of the plurality of the memory cells includes:
        a resistive memory device that has a high resistance state or a low resistance state according to data stored therein; and
        a selection device which is coupled to the resistive memory device in series,
    wherein the selected memory cell is turned on when the first read voltage is applied to the selected memory cell and the resistive memory device of the selected memory cell has the low resistance state, and the selected memory cell is turned off when the first read voltage is applied to the selected memory cell and the resistive memory device of the selected memory cell has the high resistance state,
    wherein while the first read voltage is applied to the selected memory cell, the row circuit and the column circuit apply a first voltage to unselected memory cells among the plurality of the memory cells, the first voltage having a level lower than the level of the first read voltage, and
    wherein while the second read voltage is applied to the selected memory cell, the row circuit and the column circuit apply a second voltage to the unselected memory cells, the second voltage having a level lower than the level of the first voltage.

2. The electronic device according to claim 1, wherein the level of the second read voltage is higher than a level of a turn-off voltage, the level of the turn-off voltage being sufficiently low to turn off the selected memory cell that has been turned on when the turn-off voltage is applied to the selected memory cell.

3. The electronic device according to claim 1, wherein the selection device has snapback characteristics.

4. The electronic device according to claim 1, wherein the selection device is an Ovonic Threshold Switch (OTS) device.

5. The electronic device according to claim 1, wherein the level of the first voltage is equal to a half of the level of the first read voltage.

* * * * *